(12) United States Patent
Chang et al.

(10) Patent No.: US 7,941,734 B2
(45) Date of Patent: May 10, 2011

(54) METHOD AND APPARATUS FOR DECODING SHORTENED BCH CODES OR REED-SOLOMON CODES

(75) Inventors: Hsie-Chia Chang, Hsinchu (TW); Jau-Yet Wu, Fengshan (TW); Yen-Chin Liao, Taipei (TW)

(73) Assignee: National Chiao Tung University, Taiwan (CN)

( * ) Notice: Subject to any disclaimer, the term of this patent is extended or adjusted under 35 U.S.C. 154(b) by 315 days.

(21) Appl. No.: 12/196,321

(22) Filed: Aug. 22, 2008

(65) Prior Publication Data

US 2009/0259921 A1 Oct. 15, 2009

(30) Foreign Application Priority Data

Apr. 10, 2008 (TW) ................................ 97112964 A

(51) Int. Cl.
*H03M 13/00* (2006.01)
(52) U.S. Cl. .......................... 714/785; 714/784
(58) Field of Classification Search .................. 714/784, 714/785
See application file for complete search history.

(56) References Cited

U.S. PATENT DOCUMENTS

| | | | | |
|---|---|---|---|---|
| 4,162,480 A * | 7/1979 | Berlekamp | ............... | 714/784 |
| 4,897,839 A * | 1/1990 | Yamagishi et al. | ........... | 714/785 |
| 5,157,669 A * | 10/1992 | Yu et al. | ............... | 714/758 |
| 5,754,563 A * | 5/1998 | White | ............... | 714/757 |
| 6,061,826 A * | 5/2000 | Thirumoorthy et al. | ...... | 714/784 |
| 6,453,441 B1 * | 9/2002 | Daoudi et al. | ............... | 714/784 |
| 6,651,214 B1 * | 11/2003 | Weng et al. | ............... | 714/771 |
| 6,832,042 B1 * | 12/2004 | Shieh | ............... | 386/125 |
| 7,058,876 B1 | 6/2006 | Ireland et al. | | |
| 7,694,207 B1 * | 4/2010 | Kline et al. | ............... | 714/782 |
| 7,734,991 B1 * | 6/2010 | Newhart | ............... | 714/781 |
| 2003/0192007 A1 * | 10/2003 | Miller et al. | ............... | 714/782 |
| 2004/0078747 A1 * | 4/2004 | Miller et al. | ............... | 714/782 |
| 2008/0065966 A1 * | 3/2008 | Jiang et al. | ............... | 714/781 |

OTHER PUBLICATIONS

Davida, G. I. & Cowles, J. W., "A New Error-Locating Polynomial for Decoding of BCH Codes", pp. 235-236.
Chen, Y. & Parhi, K. K., "Area Efficient Parallel Decoder Architecture for Long BCH Codes", ICASSP 2004, pp. V-73-V-76.

* cited by examiner

*Primary Examiner* — M. Mujtaba K Chaudry
(74) *Attorney, Agent, or Firm* — Antonelli, Terry, Stout & Kraus, LLP; Hung H. Bui, Esq.

(57) ABSTRACT

The present invention proposes a method and apparatus for decoding BCH codes and Reed-Solomon codes, in which a modified Berlekamp-Massey algorithm is used to perform the decoding process and the efficiency of the decoder can be improved by re-defining the error locating polynomial as a reverse error locating polynomial, while the operation of the decoding process can be further realized by a common re-configurable module. Furthermore, the architecture of the decoder is consisted of a plurality of sets of re-configurable modules in order to provide parallel operations with different degrees of parallel so that the decoding speed requirement of the decoder in different applications can be satisfied.

12 Claims, 2 Drawing Sheets

(a) BCH code decoder (b) Reed-Solomon code decoder

Syndrome Calculation Cell          Chien Search Cell

METHOD AND APPARATUS FOR DECODING SHORTENED BCH CODES OR REED-SOLOMON CODES

CROSS-REFERENCE TO RELATED APPLICATIONS

This application claims all benefits accruing under 35 U.S.C. §119 from Taiwanese Patent Application No. 097112964, filed on Apr. 10, 2008 in the Intellectual Property Office Ministry of Economic Affairs, Republic of China, the disclosure of which is incorporated by reference herein.

FIELD OF THE INVENTION

The present invention mainly relates to an error correction mechanism for communication systems and in particular relates to a improved method and apparatus which is adapted to decoding of shortened BCH codes and Reed-Solomon codes.

BACKGROUND OF THE INVENTION AND PRIOR ART

Since their first development in the 1960's, Reed-Solomon codes and BCH codes have been widely defined and used in many communication systems and data storage systems (such as DVD, flash memory or digital video, etc.) to serve as an error correction mechanism. Especially, due to its relative long block length of the shortened BCH codes, it has become a major challenge to design a decoder—in order to fulfill high performance and high transmission requirements—which is capable of completing, in a short period of time, the decoding process for the shortened BCH code defined in DVB-S2.

For the prior-art technique, the decoding process of BCH codes mainly consists of three steps: calculating syndrome, solving the key equation, and Chien search, such as the structure shown in FIG. 1(a). The syndrome calculator computes coefficients $S_j$ for $x^{j-1}$ in the syndrome polynomial $S(x)$, where $j=1, 2, \ldots, 2t$; then the key equation solver resolves an error location polynomial $\sigma(x)$; and finally all the roots of the polynomial $\sigma(x)$ are found by using the Chien search in order to further identify error locations. For the known art in the field of Reed-Solomon decoding, decoding steps are similar to BCH decoding, which are mainly consisted of four steps as shown in FIG. 1(b): calculating syndrome, solving the key equation, Chien search and calculating error values. The main operations of the syndrome calculator and Chien search shown in FIG. 1 are both finite-field constant multiplication such as the one shown in FIG. 2. The part of syndrome computation includes 2t syndrome computation cells as shown in FIG. 2, in which 2t syndromes are generated respectively by these 2t syndrome computation cells after n cycles. On the other hand, a Chien search circuit consists of t Chien search cells as shown in FIG. 2. Initially, the operation begins by selecting 0 as an input, and then in each of the subsequent cycles, the inputs are all $\sigma_i$, while in each cycle a finite-field element is checked to see whether it is a root of $\sigma(x)$. The Chien search is then completed at n-th cycle. However, because two different cells have respective different inputs which have to be calculated and processed by different circuit configurations, hardware complexity is increased accordingly.

Prior art in this field includes: Patent Application 1, Howard H. Ireland et al, "Method and Apparatus for use in a decoder of a forward error correction (FEC) system for locating bit errors in a error locator polynomial," U.S. Pat. No. 7,058,876 B1, Jun. 6, 2006; and Literature 1, G. Davida and J. Cowles, "A new error-locating polynomial for decoding of BCH codes," *IEEE Trans. Inform. Theory*, Vol. 21, pp. 235-236, March 1975; Literature 2, Y. Chen and K. K. Parhi, "Area-efficient parallel decoder architecture for long BCH codes," IEEE International Conference on Acoustic, Speech, and Signal Processing, Vol. 5, pp. v-73-6, May, 2004.

However, the above mentioned prior art has its drawback in different respect. For example, in Patent Application 1, only an improvement for searching error locations in Chien search is provided; in Literature 1, only the definition of a reverse error location polynomial and its corresponding Berlekamp-Massey algorithm is provided without mentioning its corresponding decoder architecture and achievable performance improvement; and in Literature 2, only a Chien searching architecture for a BCH decoder that is adapted for decoding a code having relatively long code-length is provided. Its parallel operation architecture is capable of improving decoding time for long codes, while much more hardware complexity is needed. However, in both literatures, how to use the Berlekamp-Massey decoding algorithm corresponding to the reverse error location polynomial in order to jointly use part of the circuits for the syndrome calculator and Chien search as well as their corresponding parallel operation architecture so as to achieve the objective of reducing hardware cost or improving decoding rate is not discussed.

SUMMARY OF THE INVENTION

In order to resolve the above mention drawback, a decoding method is needed to improve the efficiency of the Chien search, while allowing the syndrome computation and Chien search of the decoder to share common operation cells. The design of the decoder utilizes the definition of a reverse error location polynomial which, in particular in decoding shortened Reed-Solomon codes or BCH codes which have relatively long block length, is able to reduce the number of finite-field constant multipliers needed to be used. Furthermore, syndrome computation and Chien search of the decoder may jointly use common operation cells, which is realized by a re-configurable module and is therefore able to save overall hardware complexity of the decoder and in the mean time is able to fulfill a highly complicated decoder design when decoding shortened codes.

In order to meet the above-mentioned requirement, the present invention proposes a decoding method that can be applied to BCH codes. The inventive method is characterized by the following three steps: syndrome calculation step which is adapted to detecting errors and collecting information; key equation resolving step which is used for analyzing errors based on the syndrome values obtained in the previous step, in which the definition of the reverse error locating polynomial is used to replace the definition of the original error location polynomial and the corresponding modified Berlekamp-Massey algorithm is utilized to solve the reverse error location polynomial; and a step for executing Chien search, in which the Chien search is used to find all the roots of the reverse error location polynomial in order to further identify the locations of the errors.

Moreover, the present invention also provides a decoding method which can be used to decode Reed-Solomon codes. The inventive method is characterized by the following four steps: syndrome calculation step which is adapted to detecting errors and collecting information; key equation resolving step which is used for analyzing errors based on the syndrome values obtained in the previous step, in which the definition of the reverse error locating polynomial is used to replace the definition of the original error location polynomial and the corresponding modified Berlekamp-Massey algorithm is utilized to solve the reverse error locating polynomial; a step for executing Chien search, in which the Chien search is used to find all the roots of the reverse error location polynomial in order to further identify the locations of the errors; and finally the Forney algorithm is used, along with all the roots identified by the Chien search, to calculate the error values of the error locations.

BRIEF DESCRIPTION OF THE DRAWINGS

Preferred embodiments of the present invention are hereafter described by referring to the enclosing drawings, wherein.

DETAILED DESCRIPTION OF THE PREFERRED EMBODIMENTS

The present invention is mainly related to an error correction mechanism for used in communication systems. The two key points of the present application are, respectively, (1) reverse error locating polynomial, and (2) making the syndrome calculation and Chien search use the same circuit.

Figure 3:
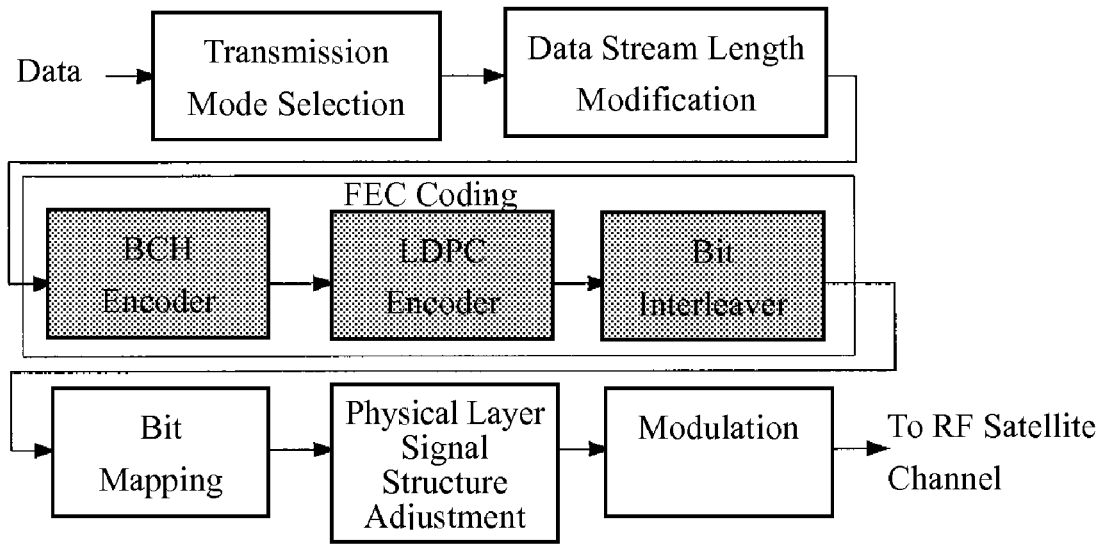
FIG. 3 shows an illustrative diagram for a transmission end of a general second generation digital video satellite broadcast system.

The present embodiment takes a digital video system as an example to illustrate the concept of the invention. FIG. 3 shows a schematic diagram for a transmission end of a second generation digital video satellite broadcast system. Each BCH code is a shortened code defined on the finite field $GF(2^{14})$ or $GF(2^{16})$.

There is a BCH encoder in the FEC encoding block. When transmitting data via a satellite to a remote site, errors may occur in the data during the transmission because the quality of the transmission path may not be good enough. The present invention provides a decoder that can be applied on the receiving end to identify and correct the errors that are incurred during the receiving process.

Because this kind of systems has extremely high requirement on the error rate (MPEG2 frame error rate<$10^{-7}$), the use of BCH codes combined with LDPC codes may satisfy the high-quality transmission requirement. Since the decoding method for LDPC may bring about error floor phenomena, it is necessary that BCH decoding error correction is performed after the LDPC decoding in order to identify error bits that cannot be resolved by an LDPC decoder.

First Embodiment

In a first preferred embodiment of the present invention, in which BCH code is served as an illustrating example, when the decoder receives incoming signals, the following steps will be performed in the inventive decoding procedure:

(a) Calculating syndrome used for detecting errors, determining errors and collecting information.

Firstly, a polynomial $R(x)=C(x)+E(x)$ is used in general to represent a received signal, where $C(x)$ is an error-free code polynomial and $E(x)=x^{j1}+x^{j2}+\ldots+x^{jv}$ in which $j1, j2, \ldots, jv$ represent v error locations that have error occurred.

Syndromes $S_1, S_2, \ldots, S_{2t}$ are calculated by using the following equation (1):

$$S_j = R(\alpha^j) = E(\alpha^j) = \sum_{i=1}^{v}(\alpha^j)^{ji} = \sum_{i=1}^{v}(\alpha^{ji})^j = \sum_{i=1}^{v}(\beta_i)^j \qquad (1)$$

where $j=1, 2, \ldots, 2t$. Under these circumstances, a traditional decoder is able to correct t errors at most. $\beta_1=\alpha^{ji}$ is called the error location number and $\alpha$ is an initial element in the finite field $GF(2^m)$.

(b) Solving the key equation for analyzing errors, in which the definition of the reverse error locating polynomial is used to replace the definition of the original error locating polynomial and the corresponding modified Berlekamp-Massey algorithm is utilized to solve the reverse error location polynomial.

A general error locating polynomial is defined as follows:

$$\sigma(x) = (1-\beta_1 x)(1-\beta_2 x) \ldots (1-\beta_v x) \qquad (2)$$

$$= \sigma_0 + \sigma_1 x + \sigma_2 x^2 \ldots + \sigma_v x^v \qquad (3)$$

However, the present application utilizes a reverse error locating polynomial which is defined as follows:

$$\tilde{\sigma}(x) = \left(1-\frac{\beta_1}{x}\right)\left(1-\frac{\beta_2}{x}\right) \ldots \left(1-\frac{\beta_v}{x}\right) \qquad (4)$$

$$= \tilde{\sigma}_0 + \tilde{\sigma}_1 x + \tilde{\sigma}_2 x^2 \ldots + \tilde{\sigma}_v x^v \qquad (5)$$

Because $(1-\beta_i x)$ in the polynomial (2) is rewritten as a reciprocal representation $(1-\beta_i/x)$ in the polynomial (4) (where $i=1, 2, \ldots, v$), it is therefore called a reverse error locating polynomial.

(c) Finding all the roots of an error locating polynomial by using Chien search in order to further identify the locations of the errors.

Figure 1:
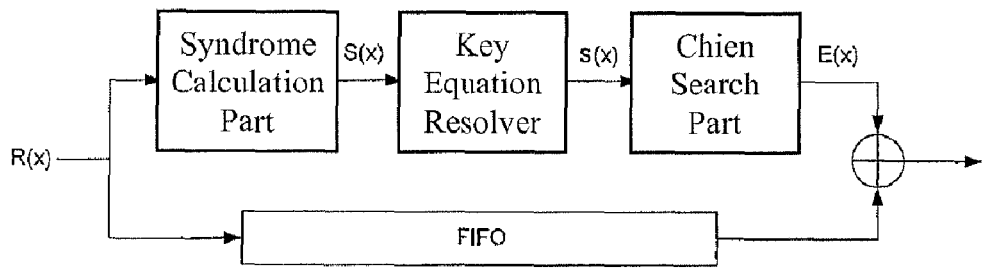
FIG. 1 shows a schematic diagram of the decoding operation for the prior-art BCH codes and Reed-Solomon codes.
Figure 1:
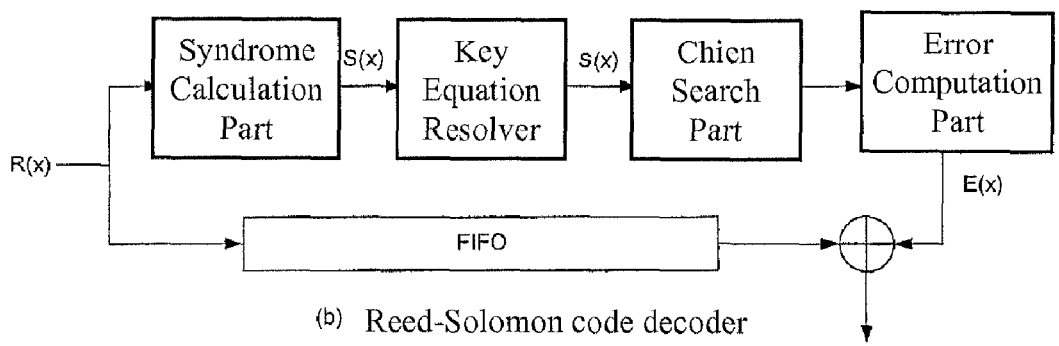
Figure 2:
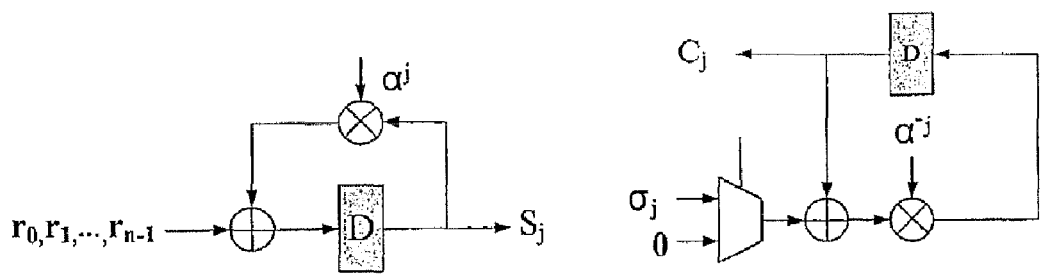
FIG. 2 shows a schematic diagram for the prior-art syndrome computation and Chien search operation.

In the following description, reference is made to FIG. 2. In the decoder shown in FIG. 2, the syndrome calculation part is consisted of 2t syndrome calculation cells, in which 2t syndromes are computed after n cycles. The Chien search part is, on the other hand, consisted of t Chien search cells, in which each cell takes $\sigma_j$ as an input when initializing the decoder and then takes 0 as an input for each cycle. At i-th cycle, $\alpha^{-i}$ is checked by the following equation to see if it is a root of the error locating polynomial:

$$\sigma(\alpha^{-i}) = \sigma_0 + \sigma_1(\alpha^{-i})^1 + \sigma_2(\alpha^{-i})^2 + \ldots + \sigma_t(\alpha^{-i})^t$$

$$= \sigma_0 + \sigma_1(\alpha^{-1})^i + \sigma_2(\alpha^{-2})^i + \ldots + \sigma_t(\alpha^{-t})^i$$

$$= \sigma_0 + C_1 + \ldots + C_t$$

After n cycles, all the roots of the error locating polynomial can be found. The inventor of the present invention discovered that, after comparing the syndrome calculation cells and the Chien search cells, during the operation process of the decoder, computations such as repeating multiplications and accumulation are very similar. These two operations may use the same hardware architecture by way of the application of the reverse error locating polynomial. That is, by means of the action of defining reciprocal in the reverse error locating polynomial, it will make $\alpha^{-j}$ in the Chien search become $\alpha^{j}$.

In other words, originally the syndrome calculation and the Chine search have two different hardware architectures, which not only cannot be used in common but also additional circuits are needed to separately execute respective functionalities. In the present invention, however, because of rewriting as a reverse error locating polynomial, which will make $\alpha^{-j}$ in the Chien search become $\alpha^{j}$, the Chien search and the syndrome calculation can use the same hardware architecture or circuit so that the hardware resource can be saved.

Figure 4:
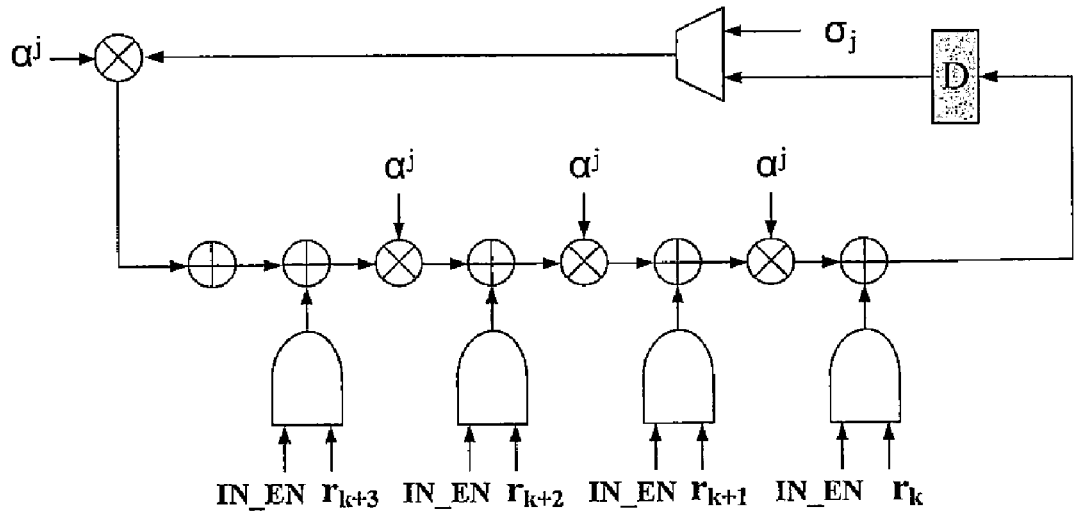
FIG. 4 shows a common architecture for four parallel syndrome calculations and Chien search operations.

As shown in FIG. 4, it illustrates a parallel schematic diagram that is common for four syndrome calculation cells and Chien search cells in juxtaposition (degree of parallel is four). For a decoder, if there are t copies of such a common structure, the number of cycles needed to compute the corresponding t syndromes and find all the roots of the error locating polynomial is $\lceil n/4 \rceil$ (i.e., the ceiling function evaluates at n/4). In this parallel architecture, IN_EN signal is used to switch between two operation steps, namely the syndrome calculation and the Chien search. If IN_EN=1, then perform the syndrome calculation, while, if IN_EN=0, then perform Chien search. In other words, a logic AND operation is performed between IN_EN and inputs $r_k, \ldots, r_{k+3}$ of R(x). Therefore, when computing syndromes, the multiplexer on the top of the figure will select the output of the register D as an input to the multiplexer and the IN_EN control signal of the bottom of the figure are all set to 1. Hence, after the logic AND operation, $r_k, \ldots, r_{k+3}$, etc. of R(x) will be allowed to be input. However, when this circuit is executing Chien search operation, the IN_EN control signal will be low. The result of the logic AND operation between IN_EN=0 and the inputs $r_k, \ldots, r_{k+3}$, etc. are all zeros, hence the Chien search operation will not be affect by the inputs $r_k, \ldots, r_{k+3}$. By way of this procedure, the syndrome calculation and the Chien search can be distinguished even in a same hardware configuration.

Although the embodiment of the present invention takes "degree of parallel=4" as an illustrative example, it however does not restrict to this case. The degree of parallel can be chosen over a wide variety of ranges in accordance with needs.

Second Embodiment

In a second preferred embodiment of the present invention, Reed-Solomon code is served as an example. For Reed-Solomon codes, there is an extra step (d) in compared with the BCH codes. This is because BCH code is a binary system. Once an error happens, it would either be zero or one and therefore there is no need to additionally calculate the error value. Except for this, the rest of the embodiment is the same as the first embodiment.

(a) Calculating syndrome used for detecting errors, determining errors and collecting information;

(b) Solving the key equation for analyzing errors, in which the definition of the reverse error locating polynomial is used to replace the definition of the original error locating polynomial and the corresponding modified Berlekamp-Massey algorithm is utilized to solve the reverse error location polynomial;

(c) Finding all the roots of an error locating polynomial by using Chien search in order to further identify the locations of the errors; and (d) Calculating error values.

The error value $e_k$ at the k-th error location can be computed using the Forney algorithm as follows:

$$e_k = \frac{-\tilde{\omega}(\beta_k)}{\beta_k \prod_{i=1, i \neq k}^{v} \left(1 - \frac{\beta_i}{x}\right)} \quad (6)$$

where $$\tilde{\omega}(x) = \tilde{\sigma}(x) S(x) \bmod x^{2t} \quad (7)$$

Similar to the first embodiment, by using the reverse error locating polynomial defined in the present invention, the effect of jointly use of a common circuit can also be achieved. That is, as shown in FIG. 4, the syndrome calculation and the Chien search can share the same hardware architecture.

Although the present invention is disclosed in the preferred embodiments described above, the inventive idea should not be limited only to those. It will be understood by those skilled in the art that various other changes in the form and details may be made without departing from the spirit and scope of the present invention. It is to be understood that various changes may be made in adapting to different embodiments without departing from the broader concepts disclosed herein and comprehended by the claims that follow.

The invention claimed is:

1. An apparatus for decoding BCH codes, comprising:
   a common operation portion;
   a key equation resolver; and
   a switching unit,
   wherein:
   the common operation portion includes a syndrome calculation logic and a Chien search logic, for detecting errors and collecting information in order to obtain syndrome values and send to the key equation resolver, and then use the Chien search logic to find all roots of a reverse error locating polynomial solved by the key equation resolver, and to further identify locations of the errors;
   the key equation resolver is provided to analyze errors by using the syndrome values, and replace an original error locating polynomial with the reverse error locating polynomial and also utilize a corresponding modified Berlekamp-Massey algorithm to solve the reverse error locating polynomial; and
   the switching unit is provided to switch between the syndrome calculation logic and the Chien search logic in the common operation portion.

2. An apparatus according to claim 1, wherein the switching unit includes at least one logic AND gate arranged to receive an output of the syndrome calculation logic and a logic high/low signal, and to perform a logic AND operation on these two signals.

3. An apparatus according to claim 1, wherein Only $\lceil n/p \rceil$ cycles are needed in calculating syndrome values and finding all the roots of the error locating polynomial by using a combination structure of the syndrome calculation logic and the Chien search logic with a degree of parallel equal to p, wherein n is the number of necessary cycles for one syndrome calculating logic to derive one syndrome value.

4. An apparatus according to claim 1, wherein the apparatus for decoding is further adapted to decode shortened BCH codes.

5. An apparatus according to claim 1, wherein the original error locating polynomial is:

$$\sigma(x) = (1 - \beta_1 x)(1 - \beta_2 x) \ldots (1 - \beta_v x),$$

and the reverse error locating polynomial for replacing the original error locating polynomial is:

$$\tilde{\sigma}(x) = \left(1 - \frac{\beta_1}{x}\right)\left(1 - \frac{\beta_2}{x}\right) \ldots \left(1 - \frac{\beta_v}{x}\right).$$

6. A method for decoding BCH codes in an apparatus for decoding according to claim 5, the method comprising:
calculating syndrome values, in which at first the switching unit is switched to the syndrome calculation logic to detect errors and collect information, to obtain syndrome values;
resolving the key equation, in which the obtained syndrome values are used to analyze errors, and an original error locating polynomial is replaced with a reverse error locating polynomial, while a corresponding modified Berlekamp-Massey algorithm is used to resolve the reverse error locating polynomial; and
performing Chien search, in which the switching unit is switched back to the Chien search logic to search all the roots of the reverse error locating polynomial and then to further identify the error locations.

7. An apparatus for decoding Reed-Solomon codes, comprising a common operation portion, a key equation resolver, an error computation portion, and a switching unit, wherein:
the common operation portion includes a syndrome calculation logic and a Chien search logic, for detecting errors and collecting information in order to obtain syndrome values and send to the key equation resolver, and use the Chien search logic to find all the roots of a reverse error locating polynomial solved by the key equation resolver, and then to further identify all the locations of the errors;
the key equation resolver is provided to analyze errors by using the syndrome values, and replace the original error locating polynomial with the reverse error locating polynomial and also utilize a corresponding modified Berlekamp-Massey algorithm to solve the reverse error locating polynomial;
the error computation portion, in which a Forney algorithm is used in conjunction with all the error values identified by the Chien search logic in the common operation portion to compute the errors at the error locations; and
the switching unit is provided to switch between the syndrome calculation logic and the Chien search logic in the common operation portion.

8. An apparatus according to claim 7, wherein the switching unit includes at least one logic AND gate arranged to receive an output of the syndrome calculation logic and a logic high/low signal, and to perform a logic AND operation on these two signals.

9. An apparatus according to claim 7, wherein only $\lceil n/p \rceil$ cycles are needed in calculating syndrome values and finding all the roots of the error locating polynomial by using a combination structure of the syndrome calculation logic and the Chien search logic with a degree of parallel equal to p, wherein n is the number of necessary cycles for one syndrome calculating logic to derive one syndrome value.

10. An apparatus according to claim 7, wherein the apparatus for decoding is further adapted to decode shortened Reed-Solomon codes.

11. An apparatus according to claim 10, wherein the original error locating polynomial is:

$$\sigma(x) = (1 - \beta_1 x)(1 - \beta_2 x) \ldots (1 - \beta_v x),$$

and the reverse error locating polynomial for replacing the original error locating polynomial is:

$$\tilde{\sigma}(x) = \left(1 - \frac{\beta_1}{x}\right)\left(1 - \frac{\beta_2}{x}\right) \ldots \left(1 - \frac{\beta_v}{x}\right).$$

12. A method for decoding Reed-Solomon codes in an apparatus for decoding according to claim 11, the method comprising:
calculating syndrome values, in which at first the switching unit is switched to the syndrome calculation logic to detect errors and collect information, to obtain syndrome values;
resolving the key equation, in which the obtained syndrome values are used to analyze errors, and an original error locating polynomial is replaced with a reverse error locating polynomial, while a corresponding modified Berlekamp-Massey algorithm is used to resolve the reverse error locating polynomial;
performing Chien search, in which the switching unit is switched back to the Chien search logic to search all the roots of the reverse error locating polynomial so as to further identify the error locations; and
computing error values, in which a Forney algorithm is used in conjunction with all the error values identified by the Chien search logic in the common operation portion to compute the errors at the error locations.

* * * * *